United States Patent [19]

Brody

[11] 4,103,341
[45] Jul. 25, 1978

[54] FERROELECTRIC PHOTOVOLTAIC METHOD AND APPARATUS FOR TRANSFERRING INFORMATION

[75] Inventor: Philip S. Brody, Brookmont, Md.

[73] Assignee: The United States of America as represented by the Secretary of the Army, Washington, D.C.

[21] Appl. No.: 824,896

[22] Filed: Aug. 15, 1977

Related U.S. Application Data

[63] Continuation-in-part of Ser. No. 533,365, Dec. 16, 1974, Pat. No. 4,015,465, which is a continuation-in-part of Ser. No. 411,853, Nov. 1, 1973, Pat. No. 3,855,004.

[51] Int. Cl.$^2$ .................. G11C 13/00; G11C 11/22; G11C 11/42
[52] U.S. Cl. .................. 365/117; 365/109; 365/145; 360/15; 355/3 R
[58] Field of Search ............ 365/109, 117, 106, 110, 365/78, 145; 360/15; 355/3 R

[56] References Cited

U.S. PATENT DOCUMENTS

| | | | |
|---|---|---|---|
| 2,985,757 | 5/1961 | Jacobs et al. | 365/106 |
| 3,497,698 | 2/1970 | Phezan et al. | 365/106 |
| 3,508,213 | 4/1970 | Hastings | 365/106 |
| 3,521,244 | 7/1970 | Weimer | 365/106 |
| 3,623,030 | 11/1971 | Sawyer | 365/109 |
| 3,855,004 | 12/1974 | Brody | 136/89 |
| 3,978,458 | 8/1976 | Veranolle | 365/117 |
| 3,989,364 | 11/1976 | Kawaxami et al. | 365/117 |

*Primary Examiner*—Terrell W. Fears
*Attorney, Agent, or Firm*—Nathan Edelberg; Robert P. Gibson; Saul Elbaum

[57] ABSTRACT

A method of transferring remanent polarization information from a photovoltaic ferroelectric unit to a polarizable unit which may either be another portion of the photovoltaic ferroelectric material or a separate piece of material. The photovoltaic ferroelectric unit is illuminated to produce a photovoltage and the voltage is applied to the unit to be polarized to induce the polarization. An optically addressable read-write photovoltaic ferroelectric memory plane having means for allowing writing and erasing of information by the transfer of remanent polarization from one portion of the memory plane to another.

17 Claims, 11 Drawing Figures

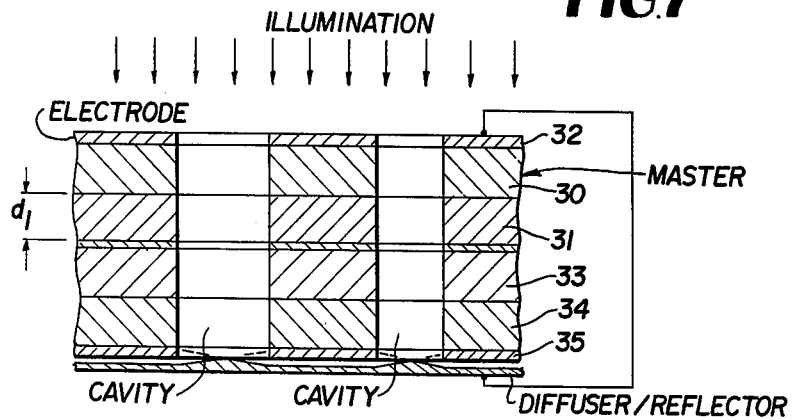
FIG.7
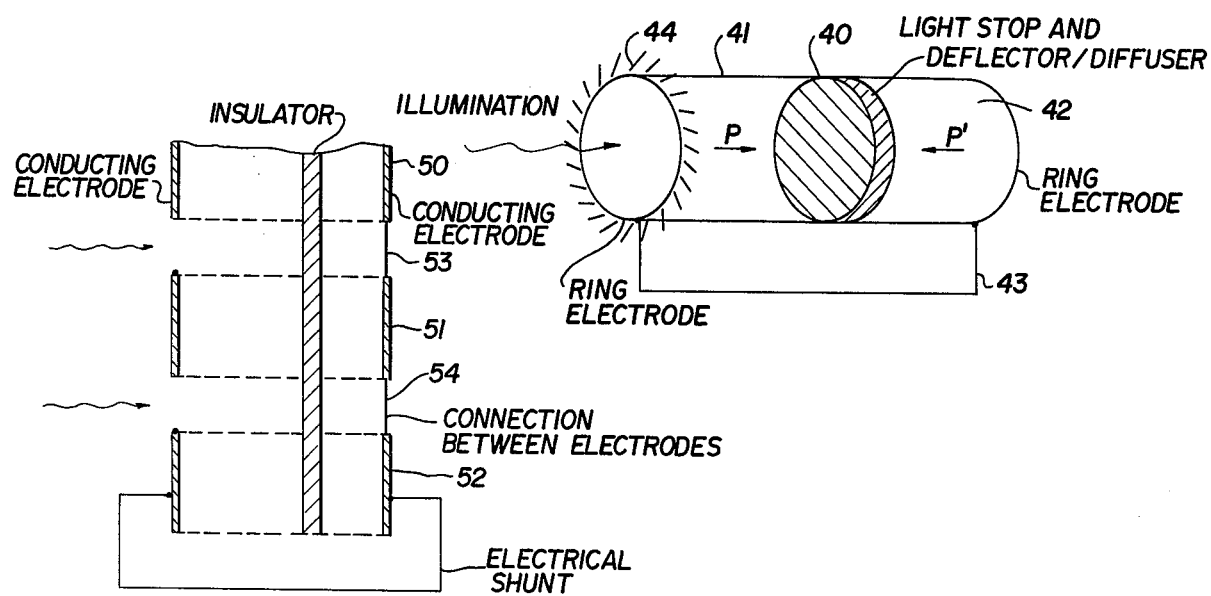
FIG.8
FIG.9   FIG.11
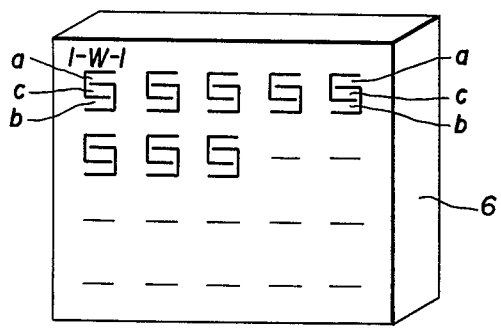
FIG.10
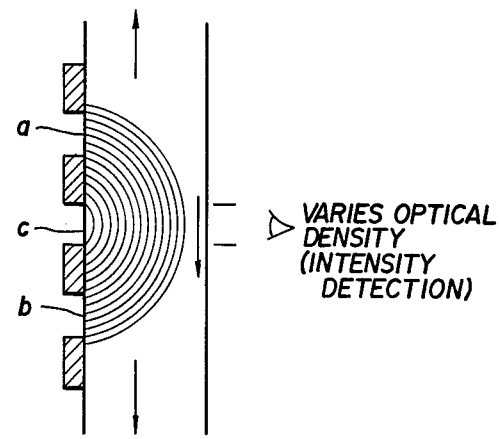

FERROELECTRIC PHOTOVOLTAIC METHOD AND APPARATUS FOR TRANSFERRING INFORMATION

RIGHTS OF THE GOVERNMENT

The invention described herein may be manufactured, used, and licensed by or for the United States Government for governmental purposes without the payment to me of any royalty thereon.

The present application is a continuation-in-part of U.S. Pat. application No. 533,365, filed Dec. 16, 1974, now U.S. Pat. No. 4,015,465 incorporated herein by reference, which in turn is a continuation-in-part of U.S. Pat. application Ser. No. 411,853 filed Nov. 1, 1973, now U.S. Pat. No. 3,855,004, also incorporated herein by reference.

The present invention relates to a method of transferring information in ferroelectric materials.

Certain ferroelectric materials, after having been remanently polarized, produce a photovoltage upon being illuminated. These materials are hereinafter referred to as photovoltaic-ferroelectric materials, and, for example, include the ferroelectric ceramic materials discussed in greater detail in the above-mentioned co-pending patent application and patent.

Briefly, it has been discovered by the inventor that the photovoltaic output of a photovoltaic ferroelectric cell may itself be utilized as a voltage source to remanently polarize other ferroelectric cells, either in the same or a different unit of ferroelectric material. This is possible because the photovoltaic output of the photovoltaic ferroelectric material is of large enough magnitude and is present for a long enough time to induce a remanent polarization in the replica material or portion.

The most important manifestation of this is that since information can be stored in ferroelectric materials in the form of remanent polarization, the stored information can be transferred in a straightforward and convenient manner, either to different ferroelectric planes or to different portions of the same plane. While the master material must be a photovoltaic ferroelectric material, the replica ferroelectric material need not be photovoltaic, and if desired, can even be a voltage induced polarizable non-ferroelectric material, such as a plastic or wax sheet.

It is therefore an object of the invention to provide a relatively simple and direct method of transferring information in ferroelectric materials.

It is a further object of the invention to provide a relatively simple and direct method of replicating information which is stored in photovoltaic ferroelectric materials.

It is an object to provide a direct method for remanently polarizing a polarizable ferroelectric material in accordance with a spatially varying illumination pattern.

It is still a further object of the invention to provide a method of transferring information from one part of a photovoltaic ferroelectric memory plane to another part of the same memory plane.

The invention will be better understood by referring to the accompanying drawings in which:

FIG. 7 is a cross-sectional view showing the replication process of the present invention as applied to a ferroelectric-photoconductive memory plane.

FIG. 8 shows the replication process of the present invention for replicating a single memory cell.

FIG. 9 shows the replication process of the present invention for replicating a plurality of memory cells.

FIG. 10 is a drawing of a read-write ferroelectric memory in which information is transferred from one part of the memory plane to another.

FIG. 11 is a cross-sectional view of the memory plane of FIG. 10.

Figure 1:
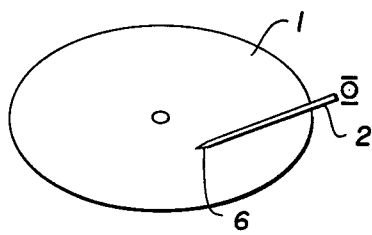
FIGS. 1 to 3 show the disk recording and playback system disclosed in co-pending Patent Application No. 824,895 filed Aug. 15, 1977.

The basic information transferring technique of the invention may be used in a great number of specific applications involving ferroelectric materials. For purposes of illustration, examples of these applications are shown in the drawings, and a better understanding of the basic invention will be had by referring to the specific applications disclosed.

Co-pending Patent Application No. 824,895 filed on the same day as the present application, discloses a photovoltaic ferroelectric disk information storage and read out device which may be replicated according to the teachings of the present invention. As pointed out in the above-mentioned patent application, availability of a contact replication process is a distinct advantage in a data recording and read out device.

Figure 3:
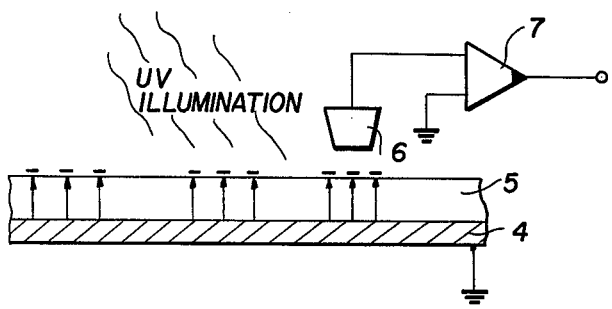
Figure 4:
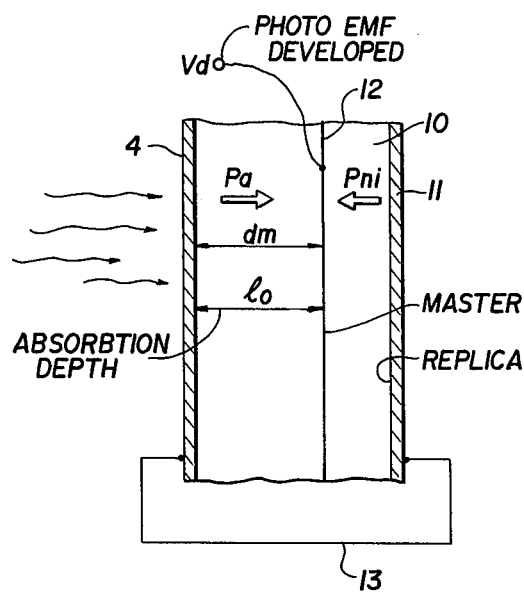
FIG. 4 is a cross-sectional view of the replication process of the present invention, as applied to the disk shown in FIGS. 1 to 3.

FIG. 4 shows a cross-section of the photovoltaic ferroelectric disk, and further shows how the stored information is transferred to a replica. Before describing the details of the replication process however, for the purpose of overall clarity, it will be useful to refer to FIGS. 1 to 3, which illustrate the details of the disk recording system disclosed in the above-mentioned patent application.

Figure 2:
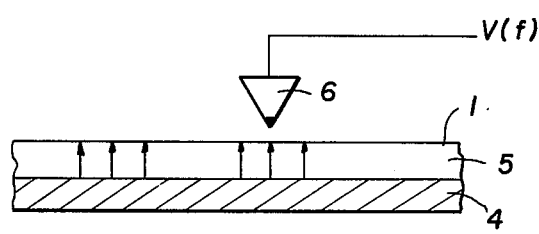

Referring to FIG. 1, data is entered into disk 1 by stylus 6 which is on the end of tracking arm 2. Disk 1 is in the shape of a conventional audio disk and as shown in cross-section in FIG. 2, is comprised of bottom conducting substrate 4 which is coated with a ferroelectric ceramic material layer 5. Coating 5 may be made of any appropriate ferroelectric ceramic material, and for a more detailed discussion of appropriate materials, see the above-identified co-pending patent and patent application. As an illustrative example, the material PZT-5 may be used.

Data is entered into the sheet by the application of a voltage between a point on the insulating ceramic surface and a conducting plane. The voltage may be applied by using a contacting stylus such as shown at 6, or by an equivalent method, such as by using an electron beam, non-contacting stylus, ion beam, or other method. Access to points on the disk is by spiral tracking as in a conventional audio disk playback unit using a pre-cut groove, a lead screw, or other method to track the input voltage point in a spiral path on the surface of the record rotating beneath the head. The mechanics of such an arrangement are considered to be well known to those skilled in the art, and are therefore not disclosed in detail. The exemplary information shown as being entered to the disk in FIG. 2 is an arbitrary pattern of alternating remanent polarization directions. It is significant to note that since the magnitude of the remanent polarization which is produced in a ferroelectric ceramic material is proportional to the amplitude of voltage applied, analog as well as digital information can be entered into the disk.

The playback signal is in the form of a modulated voltage proportional to the remanent polarization appearing between the conducting substrate and a contacting or non-contacting stylus, moving in the same path as the stylus which entered the data. The playback voltage is produced when the surface of the disk is illuminated by a source of an appropriate wavelength, and the voltage which is detected results from the charge density which appears on the insulating surface.

An illustrative playback arrangement is shown in FIG. 3 wherein the surface of the disk is illuminated by ultraviolet light and the voltage is picked up by contacting probe 6, and is fed to appropriate amplification circuitry 7. It is noted that a positive voltage appears at the portions of the disk in which a remanent polarization has been created by a positive polarizing voltage. It is possible to use a non-contacting as well as a contacting probe for playback.

Referring to FIG. 4, the replication technique of the present invention is illustrated. As has been described, the master disk, illustrated in FIGS. 1 to 3, is comprised of photovoltaic ferroelectric layer 5 and transparent conducting electrode 4. The replica disk is comprised of ferroelectric material 10 and conducting electrode 11. To effect replication, ferroelectric material 10 is placed in contact with the master ferroelectric material 5 at contact plane 12. Additionally, shorting connection 13 is provided between two electrodes to ensure that they are at the same potential during the replication process. The master photovoltaic ferroelectric material 5 is illuminated through transparent conducting electrode 4 and produces a voltage output by the photovoltaic effect discussed in the above-mentioned co-pending patent application and patent.

A replica becomes polarized when the electric field across it is greater than the coercive field of the replica material. Since the two electrodes 4 and 11 are at the same potential, the voltage appearing across layer 10 will be equal in magnitude but opposite in direction to the voltage appearing across layer 5, and if it is sufficiently great, will induce in the replica, a remanent polarization corresponding to that in the master, but in the opposite direction. At saturation, the voltage appearing across the master is proportional to the thickness of the master, it may be varied with the proviso that the light penetrates the thickness, for example, the thickness is the same or less than the absorbtion depth of the incident illumination with the photovoltaic material.

The replica should be chosen so that its photoconductivity will not unduly load the master and reduce the voltage across the replica to a value which is less than that necessary for inducing a remanent polarization. If this cannot be arranged with the particular material or materials involved, then it may be necessary to use shadowing electrodes to prevent light from causing the conductivity of the replica to increase, as is described in conjunction with the embodiment of FIG. 5.

The master should be made of a material having a high photovoltaic ferroelectric output, while the replica material should be characterized by a low coercive field, and a large charge density production under playback conditions. The master and the replica should generally, but not necessarily, be made of different materials. As an example, a useful material for the master is PZT-5A which produces an open circuit voltage of 600 volts/cm. and a useful material for the replica in conjunction with the PZT-5A master is PLZT 7/65/35, which has an even higher open circuit voltage of 1500 volts/cm., a relatively low, easily induced polarizability of about 3,000 volts/cm., and a relatively high dielectric constant of about 2,000. The high dielectric constant and open circuit voltage means that, when illuminated, the charge density on the surface, which is proportional to the open circuit voltage and the dielectric constant, is relatively high, which is desirable for playback.

Since the voltage produced by the master is proportional to the thickness of the master, and since the coercive field necessary to produce a remanent polarization in the replica is proportional to the thickness of the replica, the master is ordinarily arranged to be thicker than the replica, so that a large enough field is produced to induce a remanent polarization in the replica.

When replicating as shown in FIG. 4, care must be taken to ensure that good contact exists between the ferroelectric planes so that the total voltage drop across the master also appears across the replica.

Figure 5:
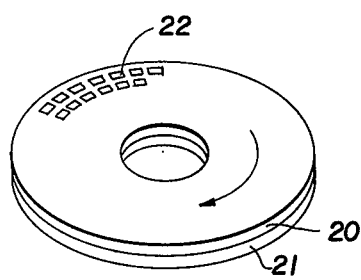
FIG. 5 is a drawing of a ferroelectric disk having an electrode array disposed on one surface.
Figure 6:
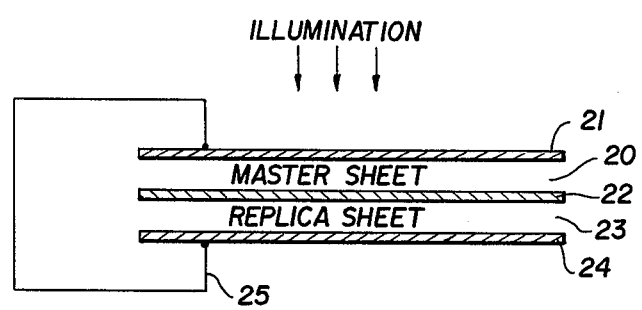
FIG. 6 is a cross-sectional view showing the replication process of the present invention as applied to the disk of FIG. 5.

The replication technique of the invention for a somewhat different type of photovoltaic ferroelectric disk is shown in FIGS. 5 and 6. Referring to FIG. 5, the disk is seen to be comprised of photovoltaic ferroelectric material 20, having transparent conductive electrode 21 disposed on one side thereof, and having a uniform array of electrodes 22, each electrically isolated from the adjacent electrode and disposed on the other side of the insulating ferroelectric material. Remanent polarization has been introduced within each capacitor element formed by the conducting transparent plane and any given electrode. Polarization can be effected by any of several methods such as a contacting head using a disk recorder arrangement, and electron beam, etc.

The replication technique is shown in FIG. 6 and it is seen that replica ferroelectric material 23 is bounded on one side by continuous electrode 24, and to effect replication, electrodes 22 are placed flush up against the surface of replica sheet 23. Electrodes 21 and 24 are connected together through shorting connection 25, and the combination is illuminated through transparent electrode 21.

The illumination produces a photovoltaic ferroelectric voltage between each capacitor plate and the transparent conducting plane 21 of the master which is proportional to the remanent polarization between the electrodes. This voltage reaches a saturation value which is also proportional to the thickness between the electrodes, and because of the presence of shorting connection 25, an equal but oppositely directed voltage appears across the replica, which induces a remanent polarization therein if greater than the coercive field of the replica.

Electrodes 22 shield the replica from the illumination, and the photoconductivity of the replica in the regions directly beneath the electrodes remains low. There is no loading of the master by the photoconductivity of the replica. It is possible in this embodiment to use the same ferroelectric material for both.

For example, in a material which is composed of grains several microns in diameter of the solid solution of lead titanate and lead zirconate which is a solid solution, 53 mole percent $PbZrO_3$ and 47 mole percent PbTiO$_3$ with 1% Nb$_2$O$_5$ by weight added, the saturation voltage is about 60 volts/mm. thickness. If we consider the replica to be made of the same material as the master, a remanent polarization is induced by voltages of about 1,000 volts/mm. provided that the voltage is maintained for a sufficient length of time. Since the photovoltaic voltage is proportional to thickness, if the replica is made to be 0.06 the thickness of the master, a region of saturated polarization in the master will produce a region of saturated remanent polarization in the replica, provided that the full saturation photovoltage of 60 volts/mm. of master thickness is across the replica. This is the case when the internal resistance of the replica is substantially higher than that of the master, which is true when shadowing electrodes such as electrodes 22 are utilized.

In co-pending Patent Application No. 824,894 filed on the same date as the present application, a memory comprised of a plurality of stacked planes is disclosed. Each plane is comprised of photovoltaic ferroelectric layer juxtaposed with a photoconductive layer and an electrode, and has a plurality of cylindrical cavities therein. Such a memory plane may be replicated by the teachings of the present invention, and the technique for doing this is shown in FIG. 7. The master memory is comprised of photovoltaic ferroelectric layer 31 juxtaposed with photocondictive layer 30 and conductive electrode 32. The replica is comprised of photovoltaic ferroelectric layer 33 juxtaposed with photoconductive layer 34 and electrode 35. In order to effect replication, shorting connection 37 is connected between electrodes 32 and 35, and the structure is illuminated. Depending on the materials used and the ratio of thicknesses of the master to the replica, light shielding between the master and the replica may or may not be needed.

An arrangement in which light shielding is utilized is shown in FIG. 8 wherein a single memory cell is replicated. In that Figure, light stop 40 is juxtaposed between materials 41 and 42. Ring electrodes 44 and 45 are connected by shorting connection 43 and material 41 is illuminated from the left in the Figure. Such an arrangement as applied to a plurality of memory cells is shown in FIG. 9 and it is seen that electrodes 50, 51 and 52 are connected to each other by connections 53 and 54.

It should be understood that while the invention requires the use of a photovoltaic ferroelectric material for the master, the replica may be made of any material which is capable of being polarized by a voltage. Thus, for example, the replica can be a photovoltaic ferroelectric material, a ferroelectric material which is read out by detecting the change in dielectric constant which results from an induced remanent polarization, or a ferroelectric material which is read out by observing the change in some optical characteristic such as scattering, or bilefringence, or by detecting pyroelectric or piezoelectric outputs. Other types of replica material besides ferroelectric are capable of being permanently or semi-permanently polarized by a voltage, such as plastic or wax sheets and these too can be remanently polarized according to the teachings of the invention.

In accordance with the invention, it is also possible to remanently polarize a polarizable ferroelectric material in accordance with a spatially varying illumination pattern. To accomplish this, a plate of uniformly polarized photovoltaic material exhibiting the high voltage photovoltaic effect, such as a photovoltaic ferroelectric material, is placed against a plate of polarizable ferroelectric material, the combination being sandwiched between two electrodes, at least one of which is transparent. The electrodes are connected together and the combination is illuminated through the transparent electrode by a spatially varying illumination pattern for a certain length of time. The general arrangement shown in FIG. 4 may be utilized for this embodiment. Additionally, a switch for controlling the exposure time in accordance with the time that the switch is closed may be added.

As in the prior embodiments, voltages are generated across the replica material and charge flow polarizing the replica. In the case of the present embodiment, the change flow is proportional to the spatially varying pattern intensity. Thus, a remanent polarization pattern which corresponds to the illumination pattern is induced in the polarizable ferroelectric material. This material can be a photovoltaic ferroelectric material in which case the recorded pattern can be retrieved by scanning with a laser beam, or it can be a photo-ferroelectric material, that is, a transparent material whose opacity depends on polarization, in which case a visual image will be generated.

As mentioned above, as well as for transferring information from a master to a replica sheet, the teachings of the present invention may be used for transferring information from one part of a ferroelectric sheet to another part of the same sheet. This aspect of the invention finds particular usefulness in memory applications, and an embodiment of a read-write memory according to the invention is shown in FIGS. 10 and 11.

Referring to FIG. 10, sheet 60 is a sheet of photovoltaic ferroelectric material such as polished PLZT 7/65/35. The sheet has a periodic electrode pattern disposed thereon, comprised of a plurality of rows of electrode paris, each pair consisting of two U-shaped interleaved electrodes 61 and 62.

Before the electrodes 61 and 62 are disposed on the photovoltaic ferroelectric sheet, portions of the sheet are selectively polarized. More specifically, the sheet portions marked "a" are polarized so that there is a remanent polarization directed upwardly and parallel to the surface in the portion, and the portions marked "b" are polarized to have a remanent polarization directed downwardly and parallel to the surface. These initial polarizations are created by any method known to those skilled in the art such as by placing temporary electrodes on the sheet, applying voltages to the electrodes to induce the desired remanent polarizations, and removing the temporary electrodes before permanent electrodes 61 and 62 are put in place. Even if the temporary electrodes are placed only on the surface of the sheet, the dielectric fringing field is still sufficient to produce remanent polarization within the bulk.

In order to write information into the memory, region "a" is illuminated with photovoltage generating illumination. Because of the electrode configuration, the illumination produces an oppositely directed polarization in region "c". In order to erase the polarization induced in region "c", region "b" is illuminated, which reverses the polarization in region "c", returning the region to its initial un-polarized state.

The remanent polarization state in region "c" can be detected optically as a result of the optical density change which is associated with the remanent polarization change for both polarized and un-polarized illumination. For example, detection may be effected with photocell means.

Write-in can be effective using either a single beam with point by point addressing, by utilizing multiple beams for simultaneous illumination of several cells, or by illuminating the entire plane, and modulating intensities at the write in points using a page composer.

The time it takes to write in a saturation remanent polarization at a point, exclusive of the addressing time, is an important quantity. It includes the time that it takes the voltage across the two-state memory cell "c" to rise in the presence of the cell capacitances to the magnitude where, $$\frac{V_c}{d_c} > E_c$$

where $E_c$ is the coercive field. It also includes the time for sufficient charge to flow to create the remanent polarization.

We can estimate this polarizing time for a particular configuration for the material PZT-5A from the formula $$i_o I_o wt \ P_s w d_o$$

$$i_o I_o t_o = P_s d_o$$

where $I_o$ is the illumination intensity for writing, $d$ is the absorbtion depth of the material at the illumination wavelength, and $i_o$ is the current constant for a surface illumination using surface electrodes. We can estimate for band gap illumination $d \sim 10^{-4}$cm, now with the $I_o$ = 1 watt/cm$^2$ and estimating $i_o$ at 0.3 × 10$^{-6}$A/cm$^2$/watt/cm$^2$ (for PZT-5A), $P_s$, the saturation remanent polarization is approximately 30 × 10$^{-6}$(c/cm$^2$). This means there is a minimum polarizing time, $t_o$, $$t_o = \frac{P_s d_o}{i_o I_o}$$

$$t_o = \frac{(30 \times 10^{-6}) \times 10^{-4}}{-3 \times 10^{-6}} = 100 \times 10^{-4} \text{sec}$$

$$t_o \sim 10\text{ms}$$

While an optical method for reading out has been described above, the direct photovoltaic output of cell $c$ can also be utilized. It is necessary that each element remain electrically isolated from adjacent elements during write in but be connected to a voltage detector for reading. Schemes using self-scanning MOS switches could be utilized. Another method for accomplishing this would be photoconducting switching, in which case a laser beam would be used to address the switch, which by way of its increased conductivity, would connect the memory cell to a read input amplifier.

I wish it to be understood that I do not desire to be limited to the exact details of construction shown and described, for obvious modifications can be made by a person skilled in the art.

What is claimed is:

1. A method of transferring information from at least a portion of a photovoltaic ferroelectric storage means to at least another portion of a polarizable storage means comprising the steps of providing at least a portion of a photovoltaic ferroelectric storage means already having a remanent polarization corresponding to said information therein and providing at least another portion of a polarizable storage means, illuminating said at least a portion which already has said remanent polarization therein, whereby a photovoltage is produced, and, applying said photovoltage across said at least another portion to which said information is to be transferred, whereby said photovoltage causes a remanent polarization to be effected in said at least another portion, and said information is transferred.

2. The method of claim 1 wherein said at least a portion which is already polarized and said at least another portion to which said information is to be transferred are at least portions of different ferroelectric memory planes.

3. The method of claim 1 wherein said at least a portion which is already polarized and said at least another portion to which said information is to be transferred are at least portions of different ferroelectric memory planes.

4. The method of claim 3 wherein said already polarized portion is a portion of a master memory plane, and said another portion is a portion of a replica memory plane, and wherein before said photovoltage is produced, said master plane and said replica plane are arranged to be in contact with each other along one planar surface of each memory plane.

5. The method of claim 4 wherein each of said master and replica has an electrode disposed on the other planar surface, and wherein before said photovoltage is produced, said electrodes are connected to each other through a shorting means.

6. The method of claim 5 wherein the remanent polarization in said master memory plane is non-uniform over said plane.

7. The method of claim 5 wherein the remanent polarization in said master memory plane is uniform over said plane, and wherein said illuminating is effected with illumination having a spatially varying intensity pattern, whereby the remanent polarization pattern induced in said replica corresponds to said pattern.

8. The method of claim 5 wherein said master memory plane comprises a photovoltaic ferroelectric layer juxtaposed between a transparent conductive planar electrode on one side which covers at least a substantial part of the area of said one side and an array of smaller electrodes on the other side.

9. The method of claim 5 wherein said master and replica memory planes each include a photoconductive layer and a ferroelectric layer, said layers having a plurality of cavities therein.

10. The method of claim 2 wherein said memory plane has a plurality of interleaved electrode pairs disposed thereon.

11. The method of claim 10 wherein said memory plane is made of a photovoltaic ferroelectric material.

12. A read-write photovoltaic ferroelectric memory comprising a plane of photovoltaic ferroelectric material, said plane having a plurality of information storage and transfer units, each unit being defined by a plurality of electrode means with said electrode means dividing each unit into at least a storage cell and a read cell, said storage cells being remanently polarized in a predetermined direction, and said electrode means comprising means for causing the remanent polarization in said storage cell to be transferred to said read cell when said storage cell is illuminated.

13. The memory of claim 12 wherein said remanent polarization which is effected in said read cell is the direction opposite to said predetermined direction.

14. The memory of claim 12 wherein said electrode means divide each unit into two storage cells and a read cell, the second of said storage cells being remanently polarized in the direction opposite to said predetermined direction, said electrode means comprising means for causing a polarization which has been effected in said read cell to be erased when said second of said storge cells is illuminated.

15. The memory of claim 14 wherein said electrode means comprise pairs of interleaved U-shaped electrodes.

16. A method of effecting a remanent polarization in a first polarizable substrate, comprising the steps of
providing a second ferroelectric ceramic substrate having a remanent polarization therein,
illuminating said second substrate whereby a photovoltage is produced, and
applying said photovoltage across said first substrate, whereby said remanent polarization is effected.

17. A method of effecting a remanent polarization in a first portion of a photovoltaic ferroelectric substrate, said substrate having a second portion having a remanent polarization therein, comprising the steps of
illuminating said second portion whereby a photovoltage is produced, and
applying said photovoltage across said first portion, whereby said remanent polarization is effected.

* * * * *